United States Patent [19]

Tung

[11] Patent Number: 4,748,347
[45] Date of Patent: May 31, 1988

[54] LOGIC COINCIDENCE GATE, TRIPLET OF LOGIC GATES AND SEQUENTIAL LOGIC CIRCUIT USING THIS LOGIC GATE

[75] Inventor: Pham N. Tung, Paris, France

[73] Assignee: Thomson-CSF, Paris, France

[21] Appl. No.: 918,877

[22] Filed: Oct. 15, 1986

[30] Foreign Application Priority Data

Oct. 18, 1985 [FR] France ................................. 85 15506

[51] Int. Cl.$^4$ ................. H03K 19/094; H03K 19/096; H03K 21/17; H03K 27/00
[52] U.S. Cl. .................................... 307/450; 307/448; 307/453; 307/481; 307/471; 377/118; 377/129
[58] Field of Search ............... 307/443, 445, 450, 448, 307/471, 479, 480, 481, 453; 377/116–118, 121, 129

[56] References Cited

U.S. PATENT DOCUMENTS

| 3,564,596 | 2/1971 | Pryor, Jr. | 307/479 X |
|---|---|---|---|
| 3,571,727 | 3/1971 | Lombardi | 377/116 X |
| 3,700,916 | 10/1972 | Vittoz | 377/116 X |
| 4,193,037 | 3/1980 | Kyu | 377/117 X |
| 4,587,664 | 5/1986 | Iida | 377/117 X |
| 4,639,621 | 1/1987 | Ikawa et al. | 307/448 X |

FOREIGN PATENT DOCUMENTS 2410914 8/1979 France ................................. 377/117

OTHER PUBLICATIONS

Conference Proceedings of the 11th European Microwave Conference, Sep. 7–11, 1981, RAI International Congress Centre, Amsterdam, Netherlands; pp. 28–37; G. Nuzillat: "GaAs Digital ICs for High-Speed Signal Processing".
IEEE Transactions on Electronic Devices, vol. ED-27, No. 6, Jun. 1980, pp. 1102–1109, IEEE, New York, U.S.; G. Nuzillat et al; "Quasi-Normally-Off MESFET Logic for High-Performance GaAs IC's".

Primary Examiner—Stanley D. Miller
Assistant Examiner—David R. Bertelson
Attorney, Agent, or Firm—Oblon, Fisher, Spivak, McClelland & Maier

[57] ABSTRACT

The invention pertains to programmable fast logic.

The logic gate of the invention comprises two parallel-mounted inverters comprising one transistor and one saturable load. The second inverter is powered through a transistor, the electrode gate of which, linked to the drain, is joined to the drain of the first inverter which may have additional inputs (OR function). A triplet of three series-mounted logic gates comprises a programming input at the third gate, a re-looping output and, in the case of a sequence of triplets, re-looping inputs at the first gate of the first triplet. A programmable logic circuit is obtained by a sequence of series-mounted triplets which are all looped back to the first gate of the sequence. The programming is obtained by placing one or two programming inputs at the logic 0 level.

Application: Programmable frequency divider circuits in which the ratios follow one another, one by one.

10 Claims, 2 Drawing Sheets

PRIOR ART
FIG_1    FIG_2    FIG_3
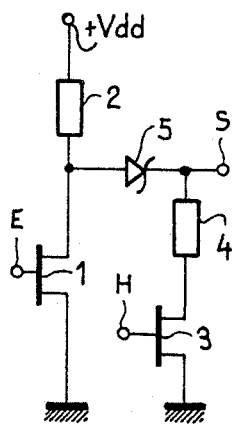
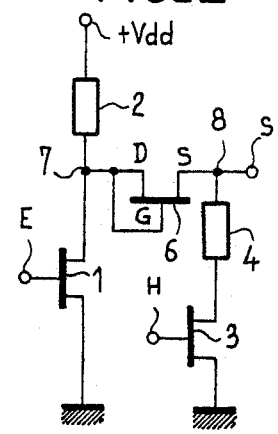
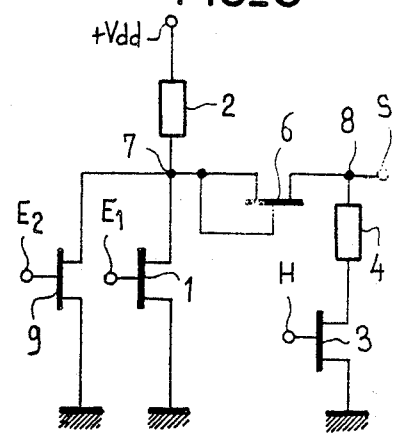
FIG_4 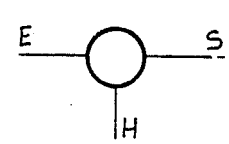   FIG_5 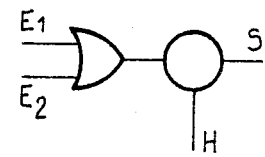
FIG_6
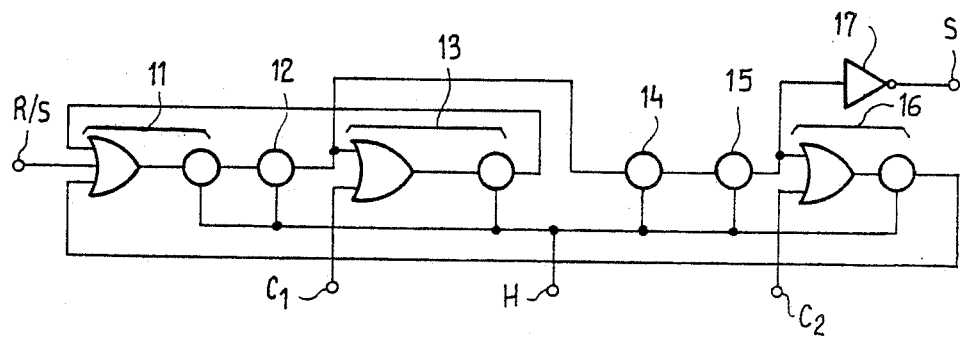
FIG_7
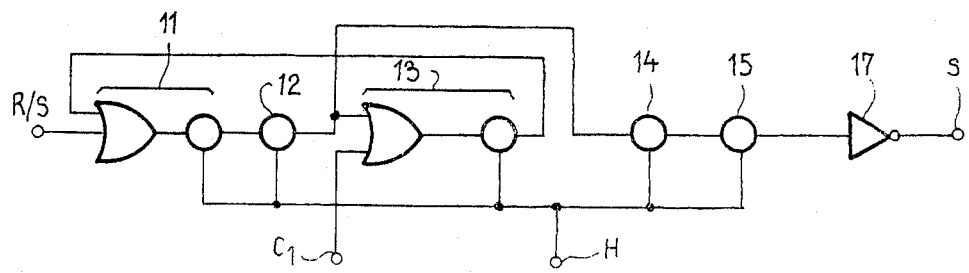

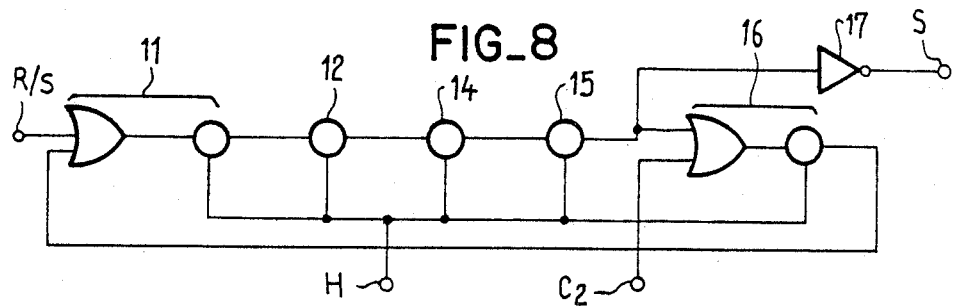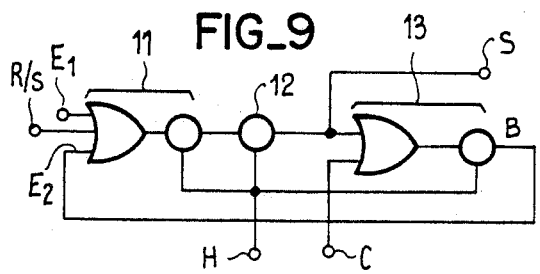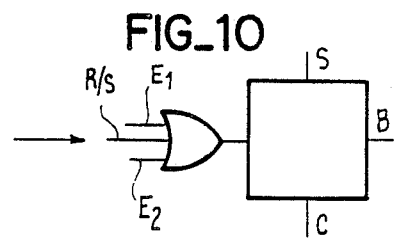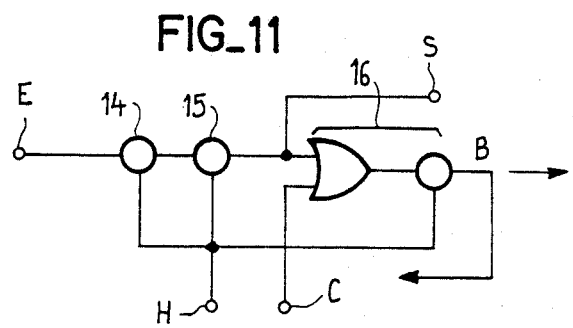

LOGIC COINCIDENCE GATE, TRIPLET OF LOGIC GATES AND SEQUENTIAL LOGIC CIRCUIT USING THIS LOGIC GATE

BACKGROUND OF THE INVENTION

Field of the Invention

The present invention pertains to the field of fast logic, and is embodied in the form of integrated circuits on semi-conducting materials of the III-IV group such as gallium arsenide. More precisely, the invention pertains to a logic coincidence gate, a triplet comprising three series-mounted logic gates and the sequential logic circuits, of a programmable frequency divider type, built by means of logic gate triplets of this kind.

Current electronic means that use very high frequency waves, for example radar and telecommunications systems, employ frequency synthesizers in which the programmable frequency dividers play a role which is all the more important as the performances of these dividers must be fitted to the level of the performances of very high frequency equipment and must function at frequencies of greater than 10 GHz.

SUMMARY OF THE INVENTION

This objective is attained by means of a logic coincidence gate, described in the French patent application No. 84.19194 registered on Dec. 14, 1984 by the Applicant, this logic gate being modified, in the present invention, so that it is given greater tripping speed and rendered capable of being looped in a circuit that comprises a triplet of three logic gates, the last one of which is looped back with the first.

By mounting several triplets of logic gates sequentially or in line, with each gate having its output connected to the input of the following triplet and being, moreover, looped back to the input (an OR gate) of the first triplet of the sequence, it is possible to build programmable synchronous frequency dividers, the dividing ratios of which succeed one another one by one: 3, 4, 5, 6, 7, etc.

Thus, a programmable frequency divider comprises a sequence of triplets of logic coincidence gates, each logic gate comprising two parallel-mounted inverters, each inverter comprising a transistor, the source of which is grounded and the drain of which is supplied with a voltage through a saturable resistor, the input of the signal being applied to the gate electrode of the first transistor of the first inverter and the clock input being applied of the gate electrode of the second transistor of the second inverter, i.e. logic gate wherein:

The first inverter comprises at least one signal input,

The second inverter is powered by a third transistor, the source of which is connected to the second saturable resistor and the drain of which, joined to the gate electrode, is connected to the first saturable resistor, at the common point between this resistor and the drain of the first transistor, The output of this logic gate being taken at the common point between the second saturable resistor and the third transistor.

BRIEF SUMMARY OF THE DRAWINGS

The invention will be better understood from the following detailed description which pertains to three examples of its application to dividers by 3, by 4 and by 5, the description being based on the appended figures wherein:

FIG. 1 is an electric diagram of a logic coincidence gate, according to the prior art, FIG. 2 is an electric diagram of a logic coincidence gate according to the invention, FIG. 3 is an electric diagram of a re-loopable logic coincidence gate according to the invention, FIG. 4 is a simplified, symbolic depiction of the gate of FIG. 2, FIG. 5 is a simplified, symbolic depiction of the gate of FIG. 3, FIG. 6 is a basic diagram, in the form of a block diagram, of a frequency divider using the logic gates of the invention, FIG. 7 is a diagram of a frequency divider by 3 according to the invention, FIG. 8 is a diagram of a frequency divider by 5 according to the invention, FIG. 9 is a diagram of a triplet of gates comprising the first stage of a sequence of triplets according to the invention, FIG. 10 is a simplified, symbolic depiction of the triplet of FIG. 9, FIG. 11 is a diagram of a triplet of gates comprising any particular stage of a sequence of triplets according to the invention, FIG. 12 is a simplified, symbolic depiction of the triplet of FIG. 11, FIG. 13 is a block diagram of a frequency divider that uses the triplets of logic gates according to the invention.

DESCRIPTION OF THE PREFERRED EMBODIMENT

FIG. 1 represents the electric diagram of a coincidence gate described in the patent application No. 84.19194 referred to above. It uses field effect transistors of normally off or normally on types, depending on the type of logic circuits in which the coincidence gate of the invention is used. However, the dynamic characteristics of the coincidence gate make its use preferable in fast integrated circuits such as those made on GaAs or more generally on materials of the III-V group.

A coincidence gate or a unanimous decision gate is the name given to a logic gate comprising at least two inputs which must be actuated simultaneously by logic levels of the coincidence gate's output to change its state. Gates in the prior art have unambiguous and fast switching-over systems depending on the logic signals applied to the inputs.

This coincidence gate changes its state only if both inputs are actuated by the same logic levels (implying coincidence). In the opposite case (i.e. anti-coincidence), the gate maintains its previous state.

The gate comprises 2 parallel-mounted transistors, the gate electrodes of which (in the case of field effect transistors) constitute inputs to the coincidence gate. Each transistor has its source grounded, and is powered by its drain through a resistor. The specific feature of this gate is that the power voltages are different for the two transistors. The first transistor 1 is powered through an initial, high value saturable resistor 2, from a voltage $+V_{DD}$. The second transistor 3 is also powered through a second saturable resistor 4, which is identical to the first resistor, but its power voltage is tapped, through a Schottky diode 5 mounted directly, at the common point between the initial saturable resistor 2 and the drain of the initial transistor 1. The output S of this coincidence gate is tapped at the common point between the Schottky diode 5 and the second saturable resistor 4. Furthermore, the supply voltage $V_{DD}$ is great in relation to the sum $V_H+V_D$, $V_H$ being the high level voltage at the output of the coincidence gate and $V_D$ being the voltage drop through the diode 5 in the "on" state.

The gate electrode of the first transistor 1 constitutes the first input E of this gate, and the gate electrode of the second transistor 3 constitutes its second input, H, which is driven by a clock signal.

Furthermore, the two saturable resistors or loads are identical with high values and a low knee voltage. They comprise hollow-channel field effect transistors without metallization of the gate electrode, behaving like normally off transistors, or they comprise transistors, the gate electrodes of which is connected to the source.

The gate of FIG. 1 therefore comprises two inverters, known as DCFL (Direct Coupled FET Logic) inverters, each inverter comprising a transistor and a load joined by a Schottky diode 5. Now, a Schottky diode on gallium arsenide has a threshold voltage of about $V_T=1$ volt (more precisely, 0.9 V for gold on nGaAs) which is a high threshold voltage that slows down the tripping speed of the gate. For, in the fast logic, the speed, i.e. the reverse of the tripping time of a device, is inversely proportionate to its threshold voltage since a signal front arriving at this device is never immediate in the strict sense of the term, but requires a certain period of build-up time even if this time is expressed in nanoseconds or picoseconds. The higher the voltage threshold, the greater the time needed for the signal to cross this threshold and cause the device to be switched over or tripped.

Hence, lowering the voltage threshold of the component that joins the two stages of this coincidence gate is a step towards perfection in switching-over speed.

FIG. 2 is the electric diagram of a coincidence gate according to the invention. It comprises an initial stage made up of an inverter, a transistor 1 and a saturable load 2, the source of the transistor being grounded, as well as a second stage made up of a second inverter, a transistor 3 and a saturable load 4. But the coupling between the point 7, which is common to the first transistor 1 and the first load 2, on the one hand, and the power supply point 8 of the second stage on the other hand, is done by a transistor 6, the gate electrode of which is connected to the drain and to the common point 7, and the source of which is connected to the power supply point 8 which also constitutes the output point S of this coincidence gate.

The value of this assembly, as compared with the one shown in FIG. 1, is that the threshold voltage of a normally off transistor, the gate electrode of which is connected to the drain, is about 0.2 V depending on the material and technology used, i.e. about five times smaller than that of a Schottky diode, a fact that increases the switching-over speed of the coincidence gate which can work at frequencies of more than 40 GHz.

The gate of FIG. 2 according to the invention comprises an input E on the first inverter and a clock input H on the second inverter. The gate of FIG. 3 comprises, in its first stage, at least two parallel-mounted transistors 1 and 9, a fact that gives it an OR function, or more precisely, since this is an inverter, an NOR function. More generally, the first stage of the coincidence gate according to the invention, comprises several parallel-mounted transistors, the gate electrodes of which constitute as many inputs $E_1$, $E_2$ D . . . having the NOR function, making it possible to re-loop this gate in a sequential assembly, i.e. to send back the output signal from a gate at position in the sequential order to an input of the first gate, or again, making it possible to actuate a gate by a control signal other than the clock signal at the input H of the second stage.

In the same way as the coincidence gate of FIG. 1, the gates of FIGS. 2 and 3 do not switch over unless both stages have the same logic state: they then function as inverters with respect to the state of the first stage. Otherwise, i.e. if the two stages do not have the same logic state, these gates preserve their previous state.

In order to simplify the structure of the figures depicting applications of the coincidence gates according to the invention, we shall depict the gate that has only one input E in its first stage (FIG. 2) by a symbol, namely a circle, provided with three external connections: an input connection E, a clock connection H and an output connection S as represented in FIG. 4. For the same reason, the gate having several inputs $E_1$, $E_2$ . . . in its first stage (FIG. 3) will be represented by a circle, preceded by an OR function as is the case in FIG. 5. Of course, these coincidence gates are powered by a voltage of $+V_{DD}$ in relation to an earth, but the depiction of the power voltage adds nothing to the understanding of the invention and will only crowd the figures.

FIG. 6 is the basic diagram, using the symbols of FIGS. 4 and 5, of a sequential logic circuit which is a programmable frequency divider. The circuit comprises two loops.

The first loop comprises a sequence of three coincidence gates, 11, 12, 13, which shall be called a triplet. The first gate 11 of the triplet is a gate provided with an OR function (as shown in FIG. 3) with three inputs: two re-looping inputs and one zeroing RS (set-reset) input. This first gate 11 has no signal input as such. The input signal is constituted by the clock signal H, which is addressed at the first gate through the re-looping inputs. The output of the gate 11 constitutes the input of the gate 12 which is a single-input gate (as shown in FIG. 2). The output of the gate 12 constitutes one of the inputs of the gate 13, provided with an OR function, the second input $C_1$ of which is controlled by a logic programming signal which is either a logic 0 or a logic 1. The output of the gate 13 is re-looped to one of the inputs of the OR function of the first gate 11. The output of this first triplet is tapped at the output of the second gate 12.

The second loop of this frequency divider comprises the gates 11 and 12 of the first triplet plus a second triplet of coincidence gates 14, 15, 16 according to the invention.

The first gate 14, which is of a single-input type, has its input connected to the output of the preceding triplet. The output of the gate 14 constitutes the input of the gate 15 which is of the single-input type. The output of the gate 15 constitutes one of the inputs of the gate 16, provided with an OR function, the second input $C_2$ of which is controlled by a programming logic signal, logic 0 or logic 1. The output of the gate 16 is re-looped to an input of the OR function of the first gate 11 of the first loop.

The output of the second gate 15 of the second loop constitutes the output S of the frequency divider which is virtually always tapped after an inverter 17. The clock inputs H of all the gates of the frequency divider are combined and controlled synchronously: this frequency divider divides its own clock frequency.

The modes of operation of this basic circuit with two loops are a function of the logic values of the control signals in $C_1$ and $C_2$.

| $C_1$ | $C_2$ | function |
|---|---|---|
| 0 | 0 | divider by 4 |
| 0 | 1 | divider by 3 |
| 1 | 0 | divider by 5 |

Let us first consider the case where $C_1=C_2=$logic 0; the circuit is a frequency divider comprising a loop of gates 11-12-13-11 and a loop of gates 11-12-14-15-16-11: these two loops close in on themselves simultaneously.

Since we know the states of an elementary coincidence gate, such as the one in FIG. 2 or FIG. 3, which does not switch over if the same logic levels are applied to the inputs of both its levels, the frequency circuit of the invention takes the form of the following table:

| Sequence | Inputs of | | | | Outputs of | | | | Output |
|---|---|---|---|---|---|---|---|---|---|
| | H | R/S | 13 & 16 | 11 | 12 | 13 & 14 | 15 | 16 | S |
| 1 | 1 | 1 | 0 | 0 | 1 | 0 | 1 | 0 | 1 |
| 1 | 0 | 1 | 0 | 0 | 1 | 0 | 1 | 0 | 1 |
| 2 | 1 | 0 | 0 | 0 | 1 | 0 | 1 | 0 | 1 |
| 2 | 0 | 0 | 0 | 1 | 1 | 0 | 1 | 0 | 1 |
| 3 | 1 | 0 | 0 | 1 | 0 | 0 | 1 | 0 | 1 |
| 3 | 0 | 0 | 1 | 1 | 0 | 1 | 1 | 0 | 1 |
| 4 | 1 | 0 | 1 | 0 | 0 | 1 | 0 | 0 | 0 |
| 4 | 0 | 0 | 1 | 0 | 1 | 1 | 0 | 1 | 0 |
| 5 | 1 | 0 | 1 | 0 | 1 | 0 | 0 | 1 | 0 |
| 5 | 0 | 0 | 1 | 0 | 1 | 0 | 1 | 1 | 1 |
| 6 | 1 | 0 | 0 | 0 | 1 | 0 | 1 | 0 | 1 |
| 6 | 0 | 0 | 0 | 1 | 1 | 0 | 1 | 0 | 1 |

Each sequence corresonds to a clock period, i.e a half-period H=logic 1 and a half-period H=logic 0.

The sequence 1 corresponds to reset at 1. Once the output R/S has been zeroized, the circuit functions with a clock H 4 cycle, i.e. a dynamic divider by 4.

FIG. 7 is the diagram of a frequency divider which has the same configuration as the divider of FIG. 6, but depicts, however, the case where the programmed control signals are $C_1=$logic 0 and $C_2=$logic 1. The symbols and reference indices of the previous figure have been kept. The condition $C_2=$logic 1 requires that the output of the gate 16 should be at logic zero: the gate 16 is inactive in this case and this is why it is not depicted in FIG. 7. Furthermore, since the output of the gate 16 is at the low logic level, it is no longer possible to speak of looping back on an OR input of the first gate 11 of the first triplet. In this case, there is no longer any loop other than one single loop 11-12-13-11, and the gates 14 and 15 of the second triplet serve only to transmit the logic states to the output S of the frequency divider, taken at the output of the second gate 15 of the second triplet. This circuit, comprising a single triplet looped back on itself, is a frequency divider by 3.

The circuit of FIG. 8 still corresponds to the same configuration as that of FIG. 6, but in the case where the programming control signals are $C_1=1$ and $C_2=0$.

The same reasoning as in the previous case lead us to consider the gate 13 of the first triplet as having an output at a low logic level: the first triplet is not looped back on itself, and the gate 13, made inactive, has been eliminated in FIG. 8. There is now only one loop, consisting of the coincidence gates 11-12-14-15-16-11. This circuit is a dynamic frequency divider by 5.

The FIGS. 6, 7 and 8 depict three cases of one and the same configuration (that of FIG. 6) comprising two triplets of coincidence gates and two loops both closed in at the OR function of the first gate of the first triplet.

More generally, frequency dividers of the order of $2n+1$ are obtained with a one-loop circuit comprising $2n+1$ coincidence gates, and frequency dividers of the order of $2n$ are obtained with a circuit comprising two loops of $2n-1$ and $2n+1$ coincidence gates. In all cases, and regardless of the number of triplets of sequentially-connected gates, the logic level of the control signals C means that a certain number of re-loopings (the outputs of gates 13 or 16) are interrupted because these outputs are at logic 0 level and only one active loop is left for a divider of an odd number in the order and two active loops for a divider with an even number in the order.

This block diagram of the programmable frequency dividing circuit is given in FIG. 13, which FIGS. 9 to 12 will make it easier to understand.

For FIG. 9 repesents a triplet of coincidence gates according to the convention established by FIGS. 4 and 5. This triplet comprises two gates, 11 and 13, provided with an OR function: it is the first triplet in a sequence, and its OR function comprises as many inputs $E_1, E_2 \ldots$ as there are triplets in the divider sequence, plus one R/S input for resetting at 1. In order to simplify the FIG. 13, we shall symbolize this triplet according to FIG. 10 by a square preceded by an OR. This square has a signals input through the OR function, a programming control input C, an output S, and a looping output B.

Similarly, FIG. 11 represents a triplet of a sequence other than that of the first triplet: only its third gate 16 is provided an OR function and this triplet shall by symbolized, according to FIG. 12, by a square with two inputs E and C and two outputs S and B.

In a sequential circuit such as the one depicted in FIG. 13, which comprises four triplets, even though this figure of four does not limit the scope of the invention, the dividing ratio of the frequency divider will be selected by setting one or two programming controls C close to 0 and the others at 1. If a single programming control C is set at logic 0, the dividing ratio is an odd number. If two neighbouring controls are set at logic 0, the dividing ratio is an even number.

The following table gives an example of the programming possibilities of a divider made with four triplets, $T_1$, $T_2$, $T_3$, and $T_4$, the programming inputs of which are $C_1$, $C_2$, $C_3$, and $C_4$.

| $C_1$ | $C_2$ | $C_3$ | $C_4$ | Function division by: |
|---|---|---|---|---|
| 0 | 1 | 1 | 1 | 3 |
| 0 | 0 | 1 | 1 | 4 |
| 1 | 0 | 1 | 1 | 5 |
| 1 | 0 | 0 | 1 | 6 |
| 1 | 1 | 0 | 1 | 7 |
| 1 | 1 | 0 | 0 | 8 |
| 1 | 1 | 1 | 0 | 9 |

According to this sequential circuit, it is possible to make a programmable frequency divider up to a relatively large number of successive division ratios because the coincidence gates, which work at very high frequencies, are constantly renewed. Consequently, the frequency dividers of the invention can be very stable despite the length of the sequences.

They are used in very high frequency systems working at frequencies of 10 to 100 GHz, wherein the received frequency is divided, as in remote detection for example, before processing the signal and the data that it contains.

Of course, the invention also comprises alternative types of sequential circuits which are obvious to the specialist: for example, it can have embodiments for application at lower frequencies in bi-polar transistors or field effect transistors on silicium.

What is claimed is:

1. A coincidence logic gate comprising:
   two parallel-mounted inverters wherein each inverter comprises,
   a transistor having its source grounded;
   a saturable resistor coupled to the drain of said transistor;
   a means for supplying—a voltage to said transistor's drain through said saturable resistor;
   means for inputting a signal to a gate electrode of the transistor in said first inverter;
   means for inputting a clock signal to a gate electrode of the transistor in said second inverter;
   a third transistor having its source connected to the saturable resistor associated with said second transistor, in said second inverter, and wherein the drain and gate electrode of said third transistor are connected between the saturable resistor of the first inverter and the transistor of the first inverter; and
   wherein the first inverter has at least one signal input and the output of said entire logic gate is taken at a common point between said saturable resistor associated with said second inverter and said third transistor.

2. A logic gate according to the claim 1 wherein the first inverter comprises at least one additional input at the source of a fourth transistor which is connected in parallel to the first transistor and forms an OR function.

3. A triplet of logic gates comprising:
   three gates wherein each gate comprises:
   two parallel-mounted inverters wherein each inverter comprises:
   a transistor having its source grounded;
   a saturable resistor coupled to the drain of said transistor;
   means for supplying a voltage to said transistor's drain through said saturable resistor;
   means for inputting a signal to a gate electrode of the transistor in said first inverter;
   means for inputting a clock signal to an electrode of the transistor in said second inverter;
   a third transistor having its source connected to the saturable resistor associated with said second transistor, in said second inverter, and wherein the drain and gate electrode of said third transistor are connected between the saturable resistor of the first inverter and the transistor of the first inverter; and
   wherein the first inverter has at least one signal input and the output of said entire logic gate is taken at a common point between said saturable resistor associated with said second inverter and said third transistor;
   wherein the input of said triplet is in the input of said first gate, the output is the output of said second gate and wherein said third gate has an additional input means and wherein the output of said third gate is re-looped.

4. A triplet of logic gates according to claim 3 wherein the first gate of the sequence comprises an additional logic 1 resetting input and at least one additional re-looping input.

5. A sequential logic circuit comprising at least two series-mounted triplets of logic gates according to claim 3 wherein:
   the gate of the first triplet comprises an additional logic 1 resetting input and as many additional re-looping inputs as there are triplets in the sequence;
   the output of a triplet is linked to the input of the following triplet in the sequence;
   the re-looping outputs of the triplets of the sequence are each connected to a re-looping input of the first gate of the first triplet.

6. A sequential logic circuit according to claim 5 forming a programmable frequency divider circuit, an odd-numbered dividing ratio being obtained by placing the programming input of one of the triplets of the sequence at logic 0 level and the programming inputs of the other triplets of the sequence at logic 1 level.

7. A sequential logic circuit according to claim 5 comprising a programmable frequency divider circuit, an odd-numbered dividing ratio being obtained by placing two programming inputs of two neighbouring triplets in the sequence at logic 0 level and the programming inputs of the other triplets of the sequence at logic 1 level.

8. A sequential logic circuit according to claim 6 comprising a frequency divider circuit with a dividing ratio of $2n+1$ by means of a single loop of $2n+1$ coincidence gates, in which those triplets, the programming inputs of which are at logic 1 level, are non-looped.

9. A sequential logic circuit according to claim 7 comprising a frequency divider circuit with a dividing ratio of $2n$ by means of two loops with $2n-1$ gates and $2n+1$ gates.

10. A sequential logic circuit according to any one of the claims 5 to 9 wherein it is made in the form of an integrated circuit on fast material from the III–V group such as GaAs.

* * * * *